United States Patent
Mieno

(10) Patent No.: US 7,569,487 B2
(45) Date of Patent: Aug. 4, 2009

(54) METHOD FOR ATOMIC LAYER DEPOSITION OF MATERIALS USING A PRE-TREATMENT FOR SEMICONDUCTOR DEVICES

(75) Inventor: Fumitake Mieno, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 266 days.

(21) Appl. No.: 11/536,472

(22) Filed: Sep. 28, 2006

(65) Prior Publication Data
US 2007/0071894 A1    Mar. 29, 2007

(30) Foreign Application Priority Data
Sep. 28, 2005  (CN)  .................... 2005 1 0030307

(51) Int. Cl.
*H01L 21/44* (2006.01)
(52) U.S. Cl. .............. 438/707; 438/680; 438/770; 134/2; 257/E21.268
(58) Field of Classification Search ............. 438/707, 438/770, 680; 134/2
See application file for complete search history.

(56) References Cited

U.S. PATENT DOCUMENTS 6,806,145 B2 * 10/2004 Haukka et al. ............. 438/287

2005/0118782 A1 * 6/2005 Kim et al. ................ 438/409
2005/0205010 A1 * 9/2005 Ferro et al. .............. 118/715
2005/0239297 A1 * 10/2005 Senzaki et al. ........... 438/785

OTHER PUBLICATIONS

Ritala and Leskela, "Atomic Later Deposition." *Handbook of Thin Film Materials*, H.S. Nalwa, ed., vol. 1, Ch. 2, pp. 103-159. San Diego: Academic Press (2002).

* cited by examiner

*Primary Examiner*—Alexander G Ghyka
(74) *Attorney, Agent, or Firm*—Townsend and Townsend and Crew LLP

(57) ABSTRACT

A method for forming atomic layer deposition. The method includes placing a semiconductor substrate (e.g., wafer, LCD panel) including an upper surface in a chamber. The upper surface includes one or more carbon bearing species and a native oxide layer. The method includes introducing an oxidizing species into the chamber. The method includes treating the upper surface of the semiconductor substrate to remove the one or more carbon bearing species and form a particle film of silicon dioxide overlying the upper surface. The method includes introducing an inert gas into the chamber to purge the chamber of the oxidizing species and other species associated with the one or more carbon bearing species. A reducing species is introduced into the chamber to strip the particle film of silicon dioxide to create a substantially clean surface treated with hydrogen bearing species. The method includes performing another process (e.g., atomic layer deposition) on the substantially clean surface while the substrate is maintained in a vacuum environment. The substantially clean surface is substantially free from native oxide and carbon bearing particles.

19 Claims, 5 Drawing Sheets

METHOD FOR ATOMIC LAYER DEPOSITION OF MATERIALS USING A PRE-TREATMENT FOR SEMICONDUCTOR DEVICES

CROSS-REFERENCES TO RELATED APPLICATIONS

This application claims priority to Chinese Application No. 200510030307.7; filed on Sep. 28, 2005; commonly assigned, and of which is hereby incorporated by reference for all purposes.

BACKGROUND OF THE INVENTION

The present invention is directed to integrated circuits and their processing for the manufacture of semiconductor devices. More particularly, the invention provides a method and structures for depositing one or more films of materials using atomic layer deposition under a precursor treatment. Merely by way of example, the invention has been applied to the manufacture of advanced integrated circuit devices, but it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is formation of films using chemical vapor deposition techniques. These chemical vapor deposition techniques, commonly called CVD, often use precursor gases that are introduced using a plasma environment. The gases often form layers of materials, including insulation, semiconductor, and conductor. Although widely used in the manufacturing of semiconductor devices, CVD techniques often lack good step coverage for smaller features. These smaller features are often less than about 0.2 μm and has an aspect ratio about 10, but can be others.

Accordingly, atomic layer deposition (ALD) techniques have been proposed. These techniques provide films will good step coverage over such smaller features. An example of ALD has been described by M. Ritala and M. Leskela, "Atomic Layer Deposition", in Handbook of Thin Film Materials, H. S. Nalwa, ed., Vol. 1, 103 (2002). Unfortunately, ALD techniques have certain limitations. For example, ALD techniques are often difficult to maintain without contamination problems. Contamination often leads to device failure and reliability issues. These and other limitations may be found throughout the present specification and more particularly below.

From the above, it is seen that an improved technique for processing semiconductor devices is desired.

BRIEF SUMMARY OF THE INVENTION

According to the present invention, techniques directed to integrated circuits and their processing for the manufacture of semiconductor devices are provided. More particularly, the invention provides a method and structures for depositing one or more films of materials using atomic layer deposition under a precursor treatment. Merely by way of example, the invention has been applied to the manufacture of advanced integrated circuit devices, but it would be recognized that the invention has a much broader range of applicability.

In a specific embodiment, the present invention provides a method for forming atomic layer deposition. The method includes placing a semiconductor substrate (e.g., wafer, LCD panel) including an upper surface in a chamber. The upper surface includes one or more carbon bearing species (e.g., $C_xH_y$) and a native oxide layer, e.g., $SiO_2$. The carbon bearing species and native oxide are considered contaminants that are undesirable according to a specific embodiment. The method includes introducing an oxidizing species (e.g., ozone, oxygen bearing plasma) into the chamber. The method includes treating the upper surface of the semiconductor substrate with the oxidizing species to remove the one or more carbon bearing species and form a particle film of silicon dioxide overlying the upper surface. The method includes introducing an inert gas (e.g., argon) into the chamber to purge the chamber of the oxidizing species and other species associated with the one or more carbon bearing species. A reducing species is introduced into the chamber to strip the particle film of silicon dioxide to create a substantially clean surface treated with hydrogen bearing species. The method includes performing another process on the substantially clean surface while the substrate is maintained in a vacuum environment. The substantially clean surface is substantially free from native oxide and carbon bearing particles.

In an alternative specific embodiment, the present invention provides a method for forming a film by atomic layer deposition. The method includes placing a semiconductor substrate including an upper surface in a chamber. The upper surface includes one or more carbon bearing species and a native oxide layer. The method also includes introducing an oxidizing species into the chamber and treating the upper surface of the semiconductor substrate to remove the one or more carbon bearing species and form a particle film of silicon dioxide overlying the upper surface. The method includes increasing a temperature of the upper surface during a portion of time associate with the treating of the upper surface. A step of introducing an inert gas into the chamber to purge the chamber of the oxidizing species and other species associated with the one or more carbon bearing species is included. The method includes introducing a reducing species to strip the particle film of silicon dioxide to create a substantially clean surface treated with hydrogen bearing species. The method then performs an atomic layer deposition process on the substantially clean surface while the substrate is maintained in a vacuum environment to form an atomic layer deposition film. The substantially clean surface being substantially free from native oxide and carbon bearing particles.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for design rules of 0.1 microns and less. Preferably, the invention provides an atomic layer deposition process with a precursor treatment to substantially clean surfaces for atomic layer deposition. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques directed to integrated circuits and their processing for the manufacture of semiconductor devices are provided. More particularly, the invention provides a method and structures for depositing one or more films of materials using atomic layer deposition under a precursor treatment. Merely by way of example, the invention has been applied to the manufacture of advanced integrated circuit devices, but it would be recognized that the invention has a much broader range of applicability.

Figure 1:
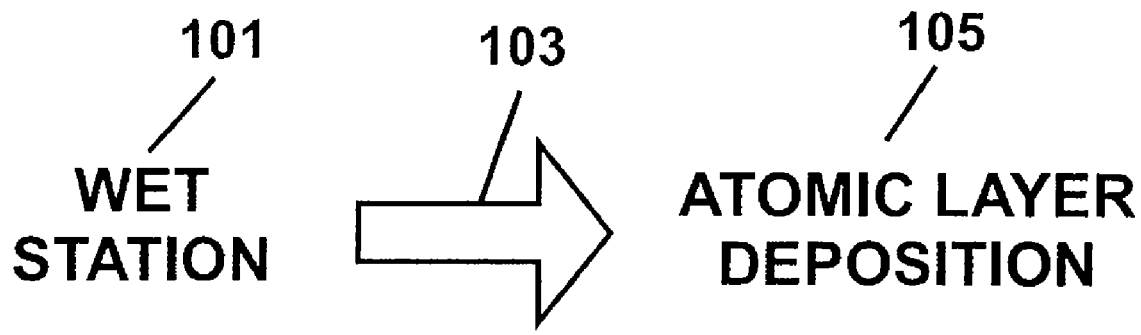
FIG. 1 illustrates a conventional method for atomic layer deposition.

FIG. 1 illustrates a conventional method for atomic layer deposition. As shown, the conventional method 100 includes a pretreatment step 101 followed 103 by an atomic layer deposition 105 step. The pretreatment step is often a wet process, which uses wet chemistries. In a specific embodiment, the wet chemistries include SC-1 (i.e., RCA clean), de-ionized water, and diluted hydrofluoric acid (HF). Limitations exist with the conventional method for atomic layer deposition. Contaminants form between an overlying film deposited by atomic layer deposition and the substrate. Details of such contaminants are provided in FIG. 2.

Figure 2:
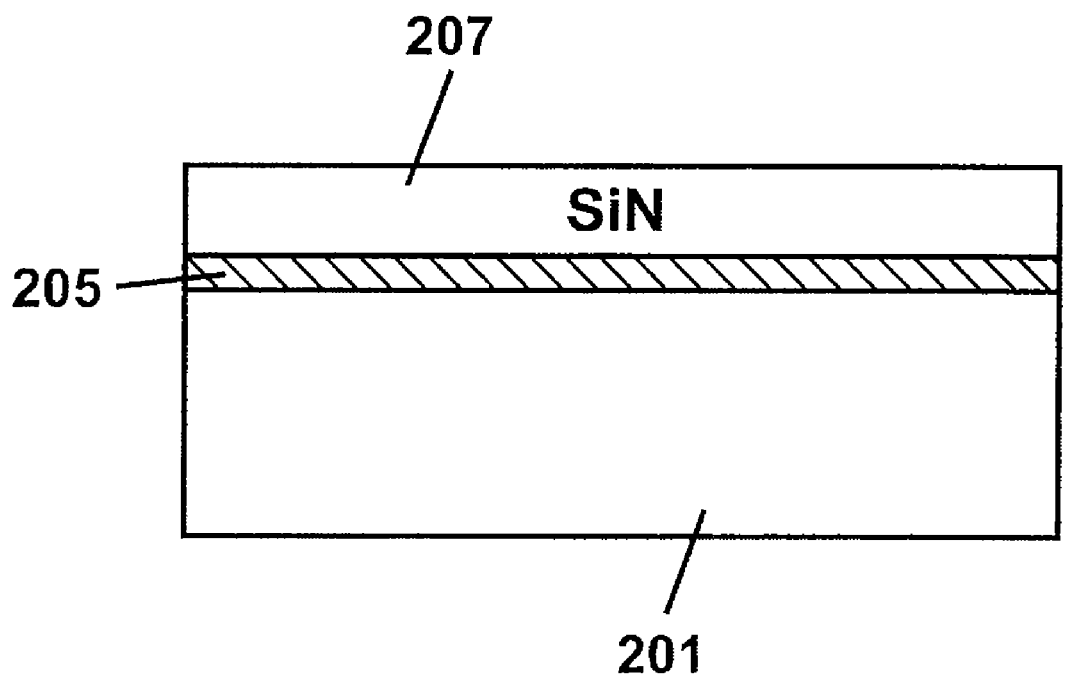
FIG. 2 is a simplified cross-sectional view diagram of a substrate having an atomic layer formed according to the conventional method.
Figure 3:
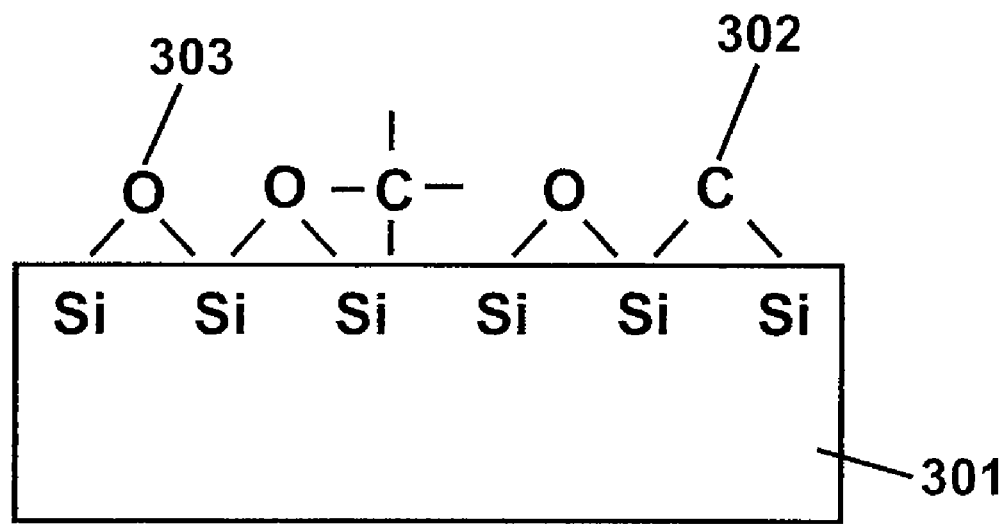
FIGS. 3 through 8 illustrate a method for atomic layer deposition using a pretreatment process according to embodiments of the present invention.

FIG. 2 is a simplified cross-sectional view diagram of a substrate 200 having an atomic layer formed according to the conventional method. The substrate includes a silicon wafer 201. Overlying the surface of the silicon wafer is silicon nitride layer 207, which has been deposited using atomic layer deposition. An interface 205 exists between the nitride layer and the substrate. The interface has native oxide and carbon bearing species, e.g., $C_xH_y$. The native oxide and carbon bearing species are contaminants, which are desirably removed. Details of techniques for removing such contaminants are provided throughout the present specification and more particularly below.

A pretreatment method for atomic layer deposition can be outlined as follows.
1. Provide a semiconductor substrate including an upper surface characterized by contaminants, e.g., native oxide, carbon bearing species;
2. Place the semiconductor substrate (e.g., wafer, LCD panel) into a chamber.
3. Introduce an oxidizing species into the chamber;
4. Treat the upper surface of the semiconductor substrate to remove the one or more carbon bearing species and form a particle film of silicon dioxide overlying the upper surface;
5. Introduce an inert gas into the chamber to purge the chamber of the oxidizing species and other species associated with the one or more carbon bearing species;
6. Introduce a reducing species into the chamber to strip the particle film of silicon dioxide to create a substantially clean surface treated with a plurality of hydrogen bearing species;
7. Repeat one or more of the above steps to create the substantially clean surface;
8. Perform another process on the substantially clean surface from native oxide and carbon bearing particles while the substrate is maintained in a vacuum environment; and
9. Perform other steps, as desired.

The above sequence of steps provides a method according to an embodiment of the present invention. As shown, the method uses a combination of steps including a way of cleaning a surface of a semiconductor substrate. Other alternatives can also be provided where steps are added, one or more steps are removed, or one or more steps are provided in a different sequence without departing from the scope of the claims herein. Details of using the above method for atomic layer deposition is provided below.

A method for atomic layer deposition using a pretreatment technique can be outlined as follows.
1. Provide a semiconductor substrate including an upper surface characterized by contaminants, e.g., native oxide, carbon bearing species;
2. Place the semiconductor substrate (e.g., wafer, LCD panel) into a chamber.
3. Introduce an oxidizing species into the chamber;
4. Treat the upper surface of the semiconductor substrate with the oxidizing species to remove the one or more carbon bearing species and form a particle film of silicon dioxide overlying the upper surface;
5. Provide thermal treatment to the upper surface while treating it with the oxidizing species;
6. Introduce an inert gas into the chamber to purge the chamber of the oxidizing species and other species associated with the one or more carbon bearing species;
7. Introduce a reducing species into the chamber to strip the particle film of silicon dioxide to create a substantially clean surface treated with a plurality of hydrogen bearing species;
8. Repeat one or more of the above steps to create the substantially clean surface;
9. Perform an atomic layer deposition on the substantially clean surface from native oxide and carbon bearing particles while the substrate is maintained in a vacuum environment; and
10. Perform other steps, as desired.

The above sequence of steps provides a method according to an embodiment of the present invention. As shown, the method uses a combination of steps including a way of cleaning a surface of a semiconductor substrate. Other alternatives can also be provided where steps are added, one or more steps are removed, or one or more steps are provided in a different sequence without departing from the scope of the claims herein. Further details of the present method can be found throughout the present specification and more particularly below.

FIGS. 3 through 8 illustrate a method for atomic layer deposition using a pretreatment process according to embodiments of the present invention. These figures are merely examples, which should not unduly limit the scope of the claims herein. One of ordinary skill in the art would recognize many variations, alternatives, and modifications. As shown, the method begins by providing a semiconductor substrate 300, e.g., wafer, LCD panel. Other substrates can also be used. Preferably, the substrate is a silicon wafer 301. The substrate has an upper surface. The upper surface includes one or more carbon bearing species 302 and a native oxide layer 303. The carbon bearing species and native oxide are considered contaminants that are undesirable according to a specific embodiment. Preferably, such contaminants should be removed before atomic layer deposition. The substrate is placed into a processing chamber.

Figure 4:
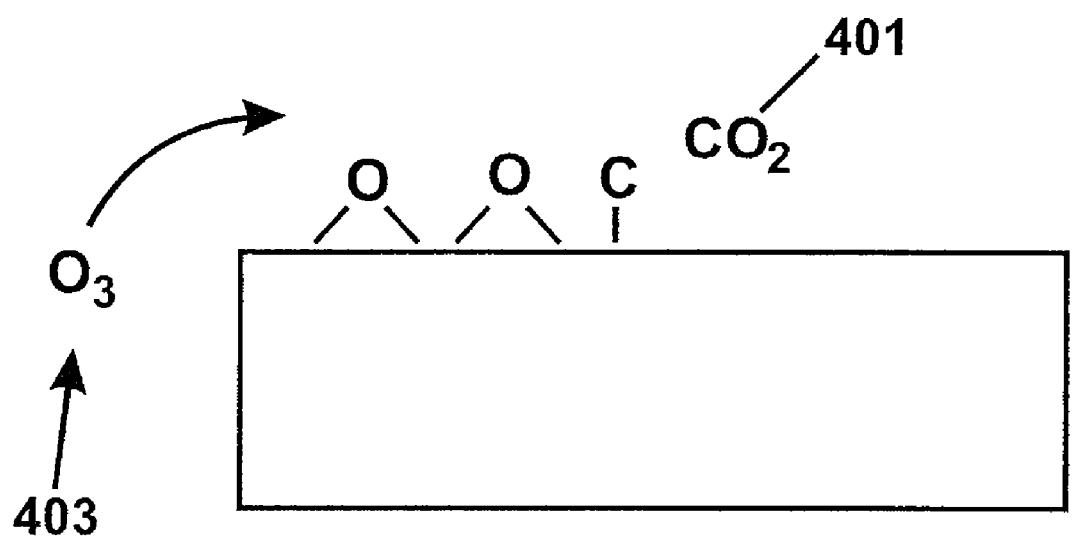

Referring to FIG. 4, the method includes introducing an oxidizing species 403 into the chamber. In a specific embodiment, the oxidizing species can be ozone, oxygen, oxygen bearing plasma, any combination of these, and the like. The method includes treating the upper surface of the semiconductor substrate with the oxidizing species to remove the one or more carbon bearing species and form a particle film of silicon dioxide overlying the upper surface. The oxidizing species combines with carbon to form volatile products 401 such as $CO_2$ gas and the like. The relationship below illustrates a chemical reaction between the oxidizing species and carbon.

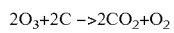

The method includes introducing an inert gas (e.g., argon) into the chamber to purge the chamber of the oxidizing species and other species associated with the one or more carbon bearing species. The one or more carbon bearing species are volatile. An example is carbon dioxide and may be others. Preferably, the temperature of the substrate is elevated during a portion of time that the oxidizing species treats the upper surface. Depending upon the embodiment, the method including treatment of the upper surface using the oxidizing species, heat treating the surface (with the treatment), and purging the chamber can be repeated until substantially all the carbon bearing species have been removed from the upper surface.

Figure 5:
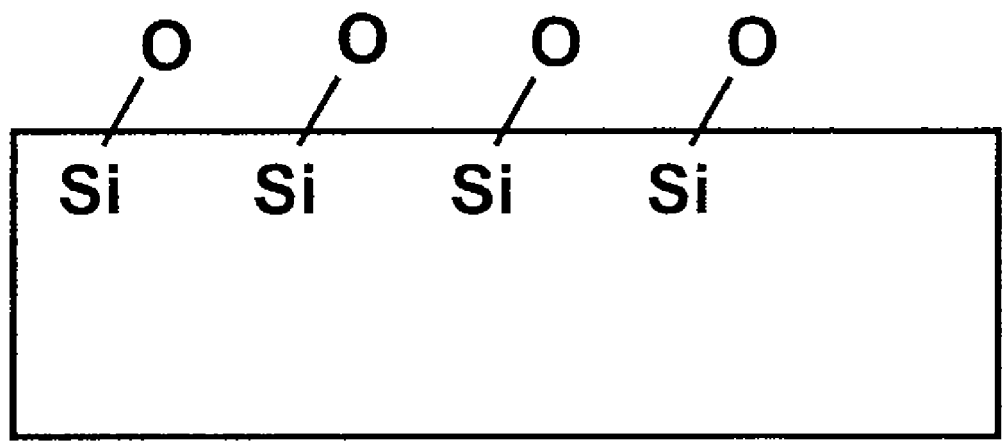
Figure 6:
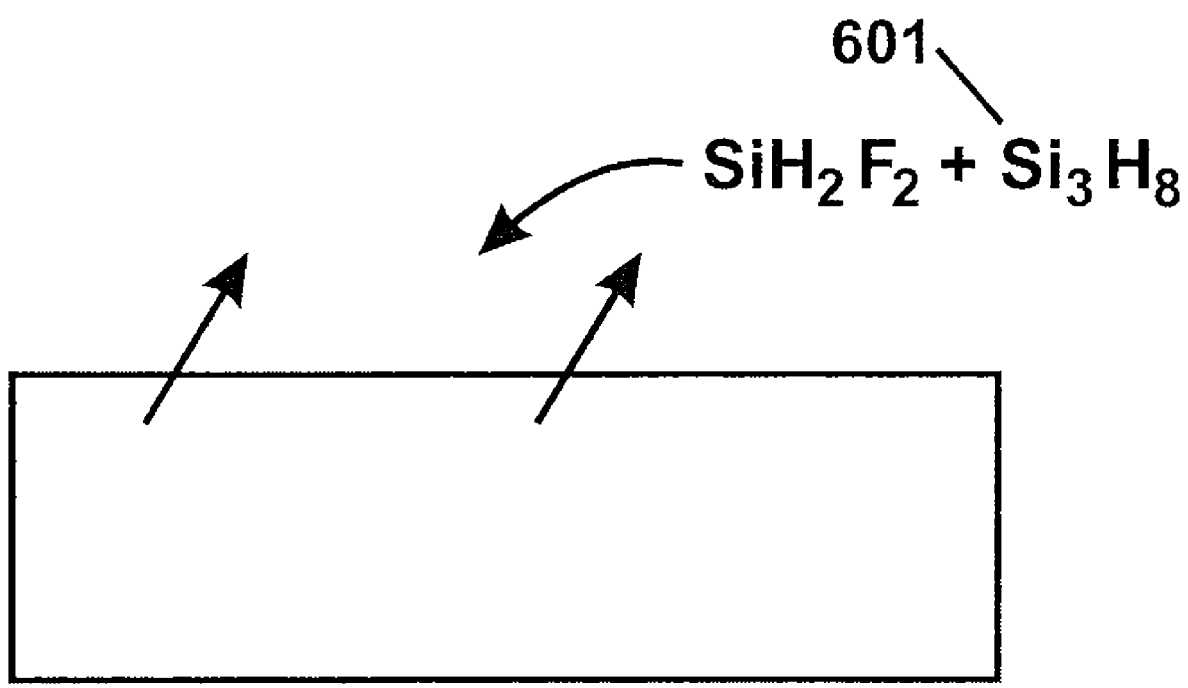
Figure 7:
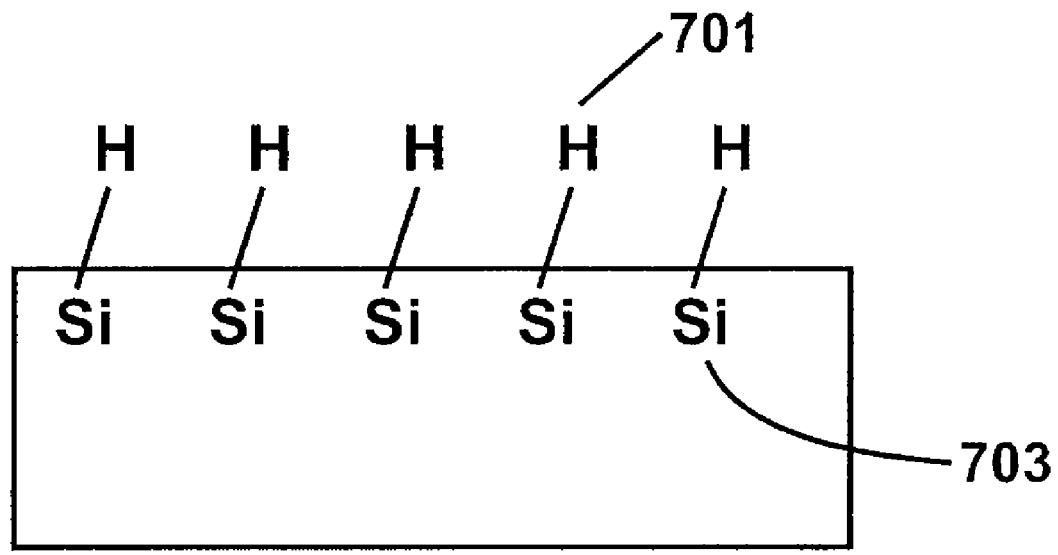
Figure 8:
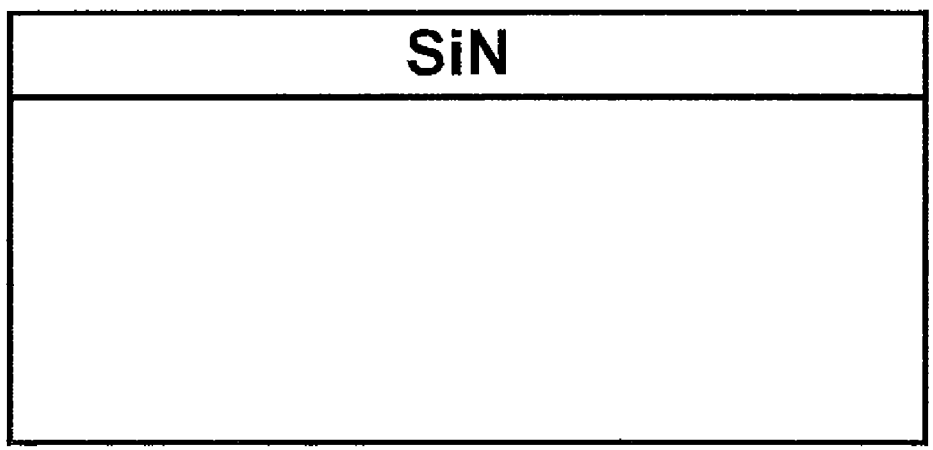

Referring to FIG. 5, the resulting substrate 500 includes a particle film of native oxide overlying the upper surface. Substantially all the carbon bearing species have been removed in a preferred embodiment. Preferably, the method removes the native oxide using a dry process. The method introduces a reducing species 601 into the chamber to strip the particle film of silicon dioxide, as shown in FIG. 6. In a specific embodiment, the reducing species can include $SiH_2F_2$, $Si_3H_8$, $SiH_4$, $Si_2H_2$, $Si_2H_6$, and $Si_2Cl_6$, MMA (Metyl Mono Amine), and combinations of these species with each other and other species. The reducing species forms volatile oxygen bearing species to strip the native oxide layer. Hydrogen bearing species replace the oxygen bearing species on the surface of the substrate 700, as shown in FIG. 7. Here, the method creates a substantially clean surface treated with hydrogen bearing species 701 attached to silicon 703. The hydrogen bearing species acts as an adhesive layer for overlying materials. Preferably, the temperature of the substrate is elevated during a portion of time that the reducing species treats the upper surface. Depending upon the embodiment, the method including treatment of the upper surface using the reducing species, heat treating the surface (with the reducing species treatment), and purging the chamber can be repeated until substantially all the native oxides have been removed from the upper surface.

Depending upon the embodiment, the thermal treatment can be performed using a variety of techniques. Preferably, the thermal treatment occurs using a rapid thermal processing technique that can be maintained at a time of less than 1 second. Examples include rapid thermal anneal, light irradiation, plasma, and remote plasma, and others. The temperature of the upper surface is increased from a first temperature to a predetermined temperature during the treatment of oxidizing species. The temperature of the upper surface is then decreased. The temperature of the upper surface is increased from a first temperature to a predetermined temperature during the treatment of reducing species. The temperature of the upper surface is then decreased. Of course, there can be other variations, modifications, and alternatives.

Once the surface has been cleaned, the method includes performing another process on the substantially clean surface while the substrate is maintained in a vacuum environment. That is, vacuum is not broken between the cleaning and the other process. Alternatively, the cleaned substrate can be transported via clean box, etc. The substantially clean surface is substantially free from native oxide and carbon bearing particles. Preferably, the upper surface is enriched with hydrogen bearing species that acts as an adhesive layer. Preferably, the method includes treating the upper surface with an atomic layer deposition process to form a substantially clean surface free from carbon bearing species and native oxide. The carbon bearing species is less than $10^{15}$ atoms/cm$^2$ and the native oxide is less than $10^{15}$ atoms/cm$^2$ according to a preferred embodiment. An example of the atomic layer deposition process can be found at $Al_2O_3$ on a silicon substrate, but can be others, depending upon the application.

Figure 9:
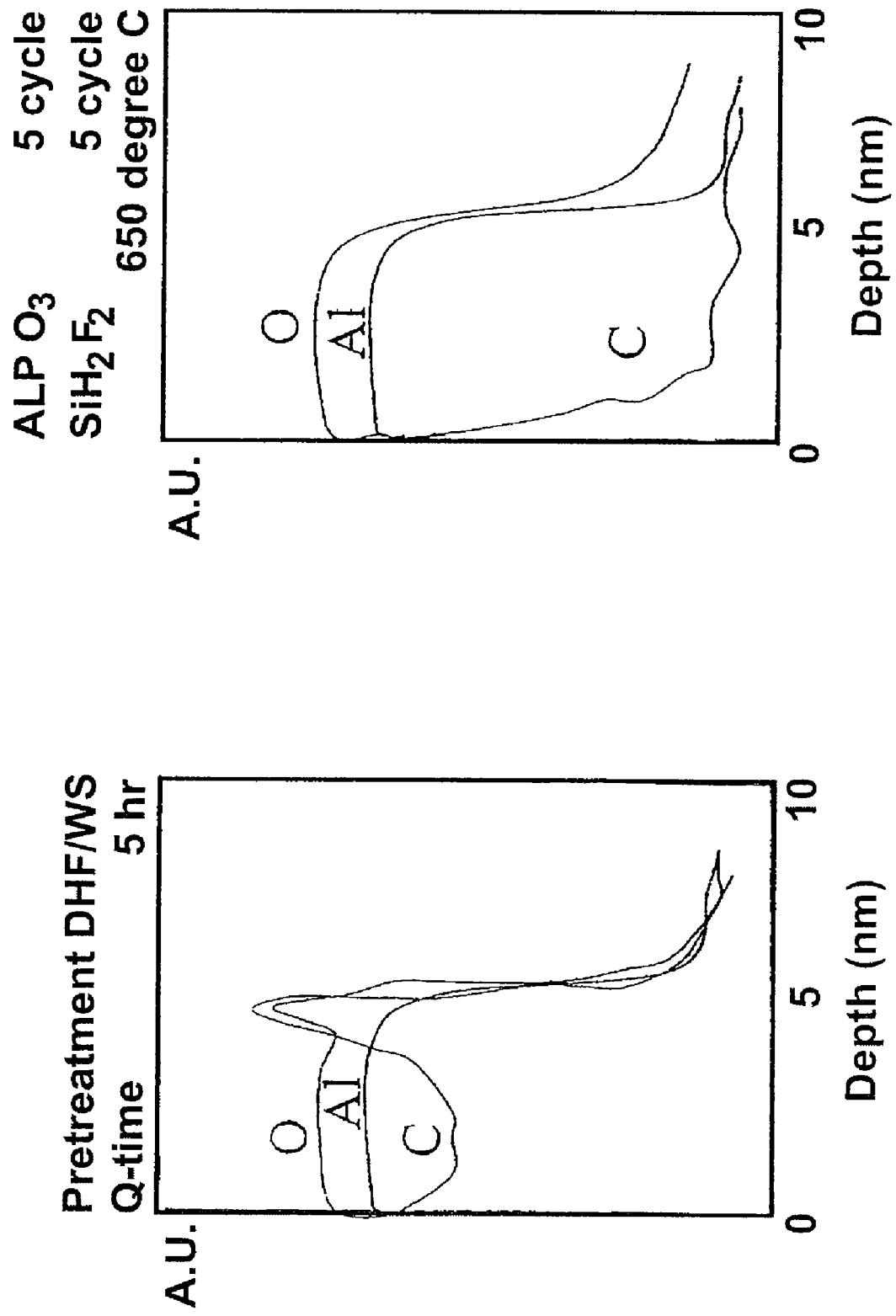
FIG. 9 is a simplified diagram illustrating experimental results derived using a method according to the present invention.

FIG. 9 is a simplified diagram illustrating experimental results derived using a method according to the present invention. This diagram is merely an example, which should not unduly limit the scope of the claims herein. One of ordinary skill in the art would recognize many variations, modifications, and alternatives. As shown, the left side of FIG. 9 shows:

Sample
Si substrate ---->Pretreatment (DHF wet station) ---->Q-time 5 hrs. ---->ALD $Al_2O_3$ deposition SIMS profile of carbon C and oxygen O shows the pile up at a interface between Si/$Al_2O_3$.

As also shown, the right side of FIG. 9 shows:

Sample
Si substrate - - - >ALP $O_3$ 5 cycle, $SiH_2F_2$ 5 cycle, 650° C. ---->ALD $Al_2O_3$ deposition SIMS profile of C and O shows no pile up at a interface between Si/$Al_2O_3$.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming atomic layer deposition, the method comprising:

placing a semiconductor substrate including an upper surface in a chamber, the upper surface including one or more carbon bearing species and a native oxide layer;
introducing an oxidizing species into the chamber;
treating the upper surface of the semiconductor substrate with the oxidizing species to remove the one or more carbon bearing species and form a particle film of silicon dioxide overlying the upper surface;
introducing an inert gas into the chamber to purge the chamber of the oxidizing species and other species associated with the one or more carbon bearing species;
introducing a reducing species to strip the particle film of silicon dioxide to create a substantially clean surface, wherein the introducing of the reducing species is provided with a thermal treatment to elevate a temperature of the upper surface to facilitate the strip of the particle film; and
treating the substantially clean surface with hydrogen bearing species; and
performing another process on the substantially clean surface while the substrate is maintained in a vacuum environment, the substantially clean surface being substantially free from native oxide and carbon bearing particles.

2. The method of claim 1 wherein the oxidizing species is ozone or an $O_2$ plasma.

3. The method of claim 1 wherein the other species include carbon monoxide and carbon dioxide.

4. The method of claim 1 wherein the inert gas is nitrogen or argon or helium.

5. The method of claim 1 further comprising repeating the introducing, treating, and introducing.

6. The method of claim 1 wherein the film is a monolayer.

7. The method of claim 1 wherein the semiconductor substrate is maintained at a temperature ranging from about 300° C. and 600° C.

8. The method of claim 1 wherein the semiconductor substrate is maintained by a rapid thermal anneal.

9. The method of claim 1 wherein the upper surface is cycled in a predetermined temperature while treating the upper surface.

10. A method for forming atomic layer deposition, the method comprising:
placing a semiconductor substrate including an upper surface in a chamber, the upper surface including one or more carbon bearing species and a native oxide layer;
introducing an oxidizing species into the chamber;
treating the upper surface of the semiconductor substrate with the oxidizing species to remove the one or more carbon bearing species and form a particle film of silicon dioxide overlying the upper surface;
increasing a temperature of the upper surface during a portion of time associate with the treating of the upper surface;
introducing an inert gas into the chamber to purge the chamber of the oxidizing species and other species associated with the one or more carbon bearing species;
introducing a reducing species to strip the particle film of silicon dioxide to create a substantially clean surface, wherein the introducing of the reducing species is provided with a thermal treatment to elevate a temperature of the upper surface to facilitate the strip of the particle film; and
treating the substantially clean surface with hydrogen bearing species; and
performing an atomic layer deposition process on the substantially clean surface while the substrate is maintained in a vacuum environment to form an atomic layer deposition film, the substantially clean surface being substantially free from native oxide and carbon bearing particles.

11. The method of claim 10 wherein the oxidizing species is ozone or an $O_2$ plasma.

12. The method of claim 10 wherein the other species include carbon monoxide and carbon dioxide.

13. The method of claim 10 wherein the inert gas is nitrogen or argon or helium.

14. The method of claim 10 further comprising repeating the introducing, treating, and introducing.

15. The method of claim 10 wherein the film is a monolayer.

16. The method of claim 10 wherein the semiconductor substrate is maintained at a temperature ranging from about 300° C. and 600° C.

17. The method of claim 10 wherein the semiconductor substrate is maintained by a rapid thermal anneal.

18. The method of claim 10 wherein the reducing species is selected from one or more compounds consisting of $SiH_2F_2$, $SiH_4$, $Si_2H_6$, $Si_3H_8$, and MMA, $Si_2Cl_6$.

19. The method of claim 10 wherein the atomic layer deposition film is selected from silicon nitride, $Al_2O_3$, $Ta_2O_5$ or $HfO_2$ and/or Si, SiGe, GaN, MMA:Metyl Mono Amine.

* * * * *